United States Patent
Lee et al.

(10) Patent No.: US 7,642,170 B2
(45) Date of Patent: Jan. 5, 2010

(54) PHASE CHANGE MEMORY CELL WITH ROUNDLESS MICRO-TRENCHES

(75) Inventors: Tzyh-Cheang Lee, Hsinchu (TW); Chun-Sheng Liang, Puyan Township, Changhua County (TW); Fu-Liang Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/864,719

(22) Filed: Sep. 28, 2007

(65) Prior Publication Data

US 2009/0087945 A1 Apr. 2, 2009

(51) Int. Cl.
*H01L 21/20* (2006.01)
(52) U.S. Cl. .............. 438/385; 438/384; 438/102; 257/E21.068; 257/E45.002
(58) Field of Classification Search .......... 438/385, 438/384, 102; 257/E21.068, E45.002
See application file for complete search history.

(56) References Cited

U.S. PATENT DOCUMENTS

2005/0152208 A1* 7/2005 Bez et al. .............. 365/232
2008/0014733 A1* 1/2008 Liu ........................ 438/597

OTHER PUBLICATIONS

Ahn, S. J., "Highly Reliable 50nm Contact Cell Technology for 256Mb PRAM", 2005 Symposium on VLSI Technology Digest of Technical Papers, pp. 98-99.
Bedeschi, Ferdinando et al., "4-Mb MOSFET-Selected μTrench Phase-Change Memory Experimental Chip", IEEE Journal of Solid-State Circuits, vol. 40, No. 7, Jul. 2005, pp. 1557-1565.
Horii, H., et al., "A Novel Cell Technology Using N-doped GeSbTe Films for Phase Change RAM 2003 Symposium on VLSI Technology Digest of Technical Papers" (12B-5), pp. 177-178.
Hwang, Y.N., et al., "Writing Current Reduction for High-density Phase-change RAM", IEDM, Advanced Technology Development, and *Process Development Semiconductor R&D Div., Samsung Electronics Co., Ltd., pp. 893-896 (37.1.1-37.1.4).
Pellizzer, F., et al., "A 90nm Phase Change Memory Technology for Stand-Alone Non-Volatile Memory Applications", 2006 Symposium on VLSI Technology Digest of Technical Papers, I-4244-0005-8/06/ 2006 IEEE.
Pellizzer, F., "Novel μ Trench Phase-Change Memory Cell for Embedded and Stand-Alone Non-Volatile Memory Applications", 2004 Symposium on VLSI Technology Digest of Technical Papers (3.1), 0-7803-8289-7/04 2004 IEEE, pp. 18-19.
Horii, H., et al., "A Novel Cell Technology Using N-doped GeSbTe Films for Phase Change RAM 2003 Symposium on VLSI Technology Digest of Technical Papers" (12B-5), pp. 177-178.
Hwang, Y.N., et al., "Writing Current Reduction for High-density Phase-change RAM", IEDM, Advanced Technology Development, and Process Development Semiconductor R&D Div., Samsung Electronics Co., Ltd., pp. 893-896 (37.1.1-37.1.4), 2003 IEEE.

* cited by examiner

*Primary Examiner*—Asok K Sarkar
*Assistant Examiner*—Julia Slutsker
(74) *Attorney, Agent, or Firm*—K&L Gates LLP

(57) ABSTRACT

A method for constructing a phase change memory device includes forming a first dielectric layer on a substrate; forming a first conductive component in the first dielectric layer; forming a second dielectric layer over the first conductive component in the first dielectric layer; forming a conductive crown in the second dielectric layer, the conductive crown being in contact and alignment with the conductive component; depositing a third dielectric layer in the conductive crown; and forming a trench filled with chalcogenic materials having an amorphous phase and a crystalline phase programmable by controlling a temperature thereof to represent logic states, wherein the trench extends across the conductive crown, such that the trench is free from a rounded end portion caused by lithography during fabrication of the phase change memory device.

20 Claims, 5 Drawing Sheets

US 7,642,170 B2

PHASE CHANGE MEMORY CELL WITH ROUNDLESS MICRO-TRENCHES

BACKGROUND

The present invention relates generally to semiconductor manufacturing, and more particularly to a method for manufacturing a phase change memory device with roundless micro-trenches.

Phase change memory is a type of non-volatile memory that uses two distinct phases of its material components to represent binary logic states. Study has shown that chalcogenic materials, such as Ge—Sb—Te-based materials, in an amorphous phase have a distinctively higher resistance than that of a crystalline phase. The crystalline phase can be obtained by raising the temperature of the chalcogenic materials above approximately 200 degrees Celsius, and maintaining it for a sufficient amount of time. The amorphous phase can be obtained by raising the temperature of the chalcogenic materials above their melting points of approximately 600 degrees Celsius, and cooling it off rapidly.

The phase change memory has certain advantages over conventional flash memory, which recognizes binary logic states by the existence or non-existence of electrons tunneling through a barrier layer into a charge trapping layer. Current leakage and tunnel barrier failure are often observed in such conventional flash memory design that requires a charge trapping layer, thereby inducing reliability issues. By using the phases of crystallization to represent logic states, the phase change memory eliminates the need of the charge trapping layer, and therefore is free from the current leakage and tunnel barrier failure issues. Moreover, the phase change memory offers much faster programming speed than the flash memory as it requires a long period of time for its charge pump to build up sufficient power for the tunneling effect to take place. Thus, the phase change memory has become one of the promising candidates for the next generation memory.

One of the challenges facing the development of the phase change memory is to reduce its power consumption, which can be quite high due to the power required to heat up the chalcogenic materials in changing their crystallization during each programming cycle. One solution of reducing the power consumption of the phase change memory is to lower its reset current level. In order to lower the reset current level, the area of the bottom electrode of the phase change memory needs to be reduced accordingly.

As such, it is desired to design a phase change memory device with reduced area of bottom electrodes in order to reduce it power consumption.

SUMMARY

The present invention is directed to a method for constructing a phase change memory device. In one embodiment of the present invention, the method includes forming a first dielectric layer on a substrate; forming a first conductive component in the first dielectric layer; forming a second dielectric layer over the first conductive component in the first dielectric layer; forming a conductive crown in the second dielectric layer, the conductive crown being in contact and alignment with the conductive component; depositing a third dielectric layer in the conductive crown; and forming a trench filled with chalcogenic materials having an amorphous phase and a crystalline phase programmable by controlling a temperature thereof to represent logic states, wherein the trench extends across the conductive crown, such that the trench is free from a rounded end portion caused by lithography during fabrication of the phase change memory device.

The construction and method of operation of the invention, however, together with additional objectives and advantages thereof will be best understood from the following description of specific embodiments when read in connection with the accompanying drawings.

DESCRIPTION

This discourse is directed to a method for manufacturing a phase change memory device with roundless micro-trenches. The following merely illustrates various embodiments of the present invention for purposes of explaining the principles thereof. It is understood that those skilled in the art will be able to devise various equivalents that, although not explicitly described herein, embody the principles of this invention.

Figure 1:
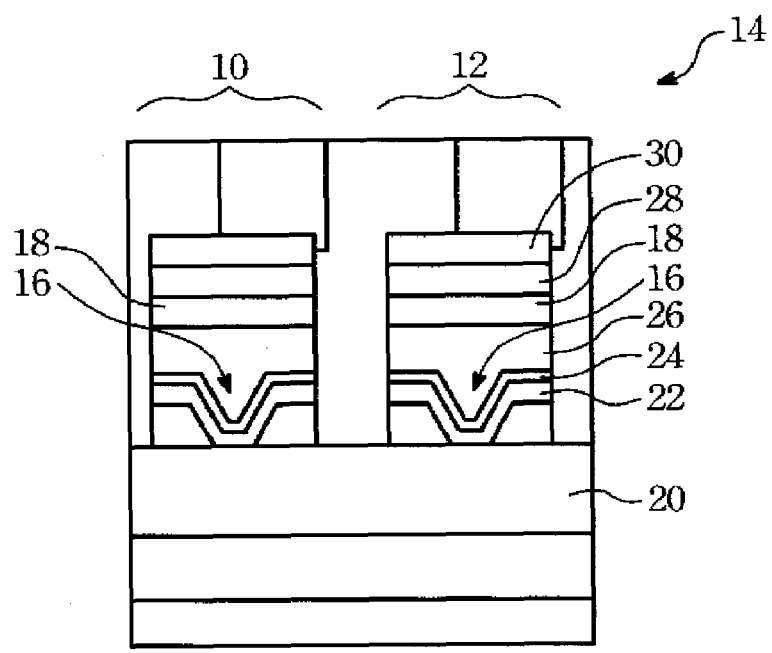
FIG. 1 illustrates a cross-sectional view of a conventional phase change memory device.

FIG. 1 illustrates a cross-sectional view of two adjacent memory cells 10 and 12 of a conventional phase change memory device 14 where a pattern of micro-trenches 16 is used to reduce the contact area between the chalcogenic layer 22 and the resistive layer 20, in order to reduce the reset current level and the power consumption. The memory cell 10 or 12 is comprised of a first chalcogenic layer 22, a barrier layer 24, a conductive layer 26, a bottom electrode 18, a second chalcogenic layer 28 and a top electrode 30. A resistive layer 20 is constructed underneath the memory cells 10 and 12 in contact with their corresponding first chalcogenic layers 22. As shown in the figure, the micro-trench 16 increases the overall surface area of the first chalcogenic layer 22 without compromising on the width of the bottom electrode 18.

Figure 2:
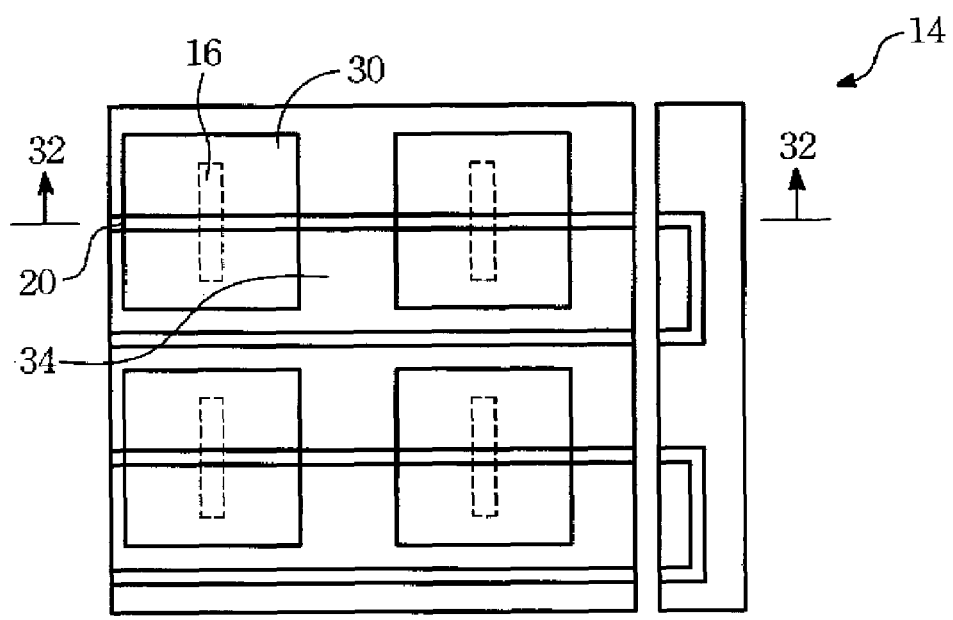
FIG. 2 illustrates a layout view of a conventional phase change memory device.

FIG. 2 partially illustrates a layout view of the conventional phase change memory device 14. The cross-section view shown in FIG. 1 is taken along the line 32, longitudinally cutting through the resistive layer 20. The micro-trench 16 is depicted in broken lines in the middle of the top electrode 30. The area surrounded by the resistive layer 20 is referred to as the heater.

In operation, electric current is conducted through the resistive layer 20 to generate heat for changing the crystallization phases of the first chalcogenic layer 22. An amorphous phase can be obtained by raising the temperature of the chalcogenic layer 22 to its melting point and then rapidly cooling it down, whereas a crystalline phase can be obtained by raising the temperature of the chalcogenic layer to a certain degree, and then holding it for a sufficient period of time.

These two phases represent binary logic states. Such conventional phase change memory device is described, for example, in the U.S. Patent Application Publication No. 2006/0097341 to Pellizzer et al.

Figure 3:
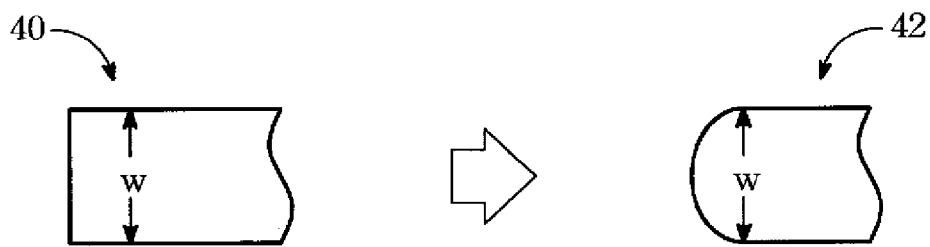
FIGS. 3-5 illustrate diagrams showing the rounding effect of the micro-trenches for conventional phase change memory devices.
Figure 4:
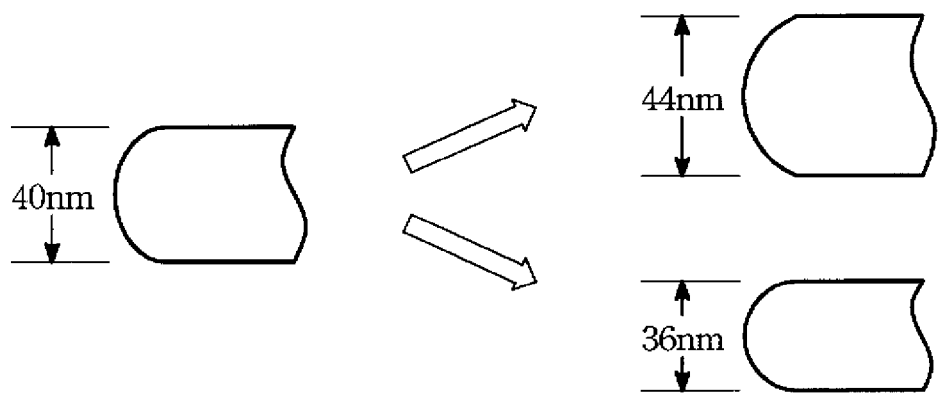
Figure 5:
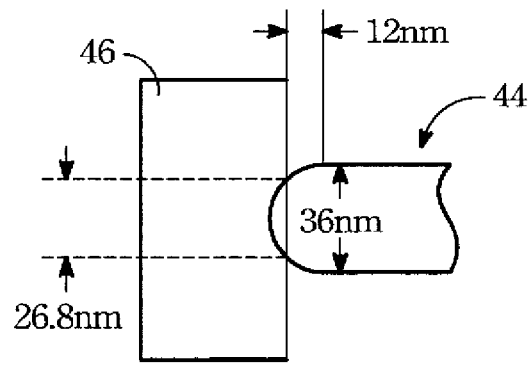

Due to process variations, the conventional phase change memory device may suffer from micro-trench rounding effects as it is continuously scaled down. Referring to FIG. 3, the diagram 40 shows an ideal layout view at an end of a micro-trench having a width of W. However, in reality, the end of the micro-trench often appears to be in a round shape after the lithography process. Moreover, due to process variations, the width W of the micro-trench 42 would vary in reality. For example referring to FIG. 4, a micro-trench designed with a width of 40 nm can have an actual width varying between 44 nm and 36 nm. These process variations may cause the micro-trench and the heater insufficiently in contact, thereby hindering the memory programming operation. For example referring to FIG. 5, a micro-trench 44 has a rounded shape with a diameter of 36 nm at one end, when it should have been in a rectangular shape having a width of 40 nm according to its original design. To compound the situation, the process variation may cause the micro-trench 44 to shift away from the heater 46, in this hypothetical case, by 12 nm. As a result, the rounded end of the micro-trench 44 only has a chord of 26.8 nm overlapping the edge of the heater 46. This significantly reduces the overlapped area between the micro-trench 44 and the heater 46, thereby hindering the programming operation of the memory device.

Figure 6:
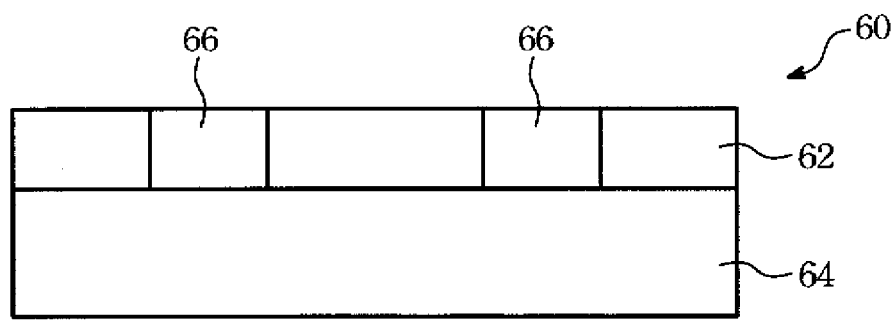
FIGS. 6-10 illustrate a series of cross-sectional view of semiconductor structures explaining the processing steps for manufacturing a phase change memory device in accordance with one embodiment of the present invention.

FIGS. 6-10 illustrate a series of cross-sectional views of semiconductor structures for showing the processing steps for manufacturing a phase change memory device in accordance with one embodiment of the present invention. FIG. 6 illustrates a phase change memory device in progress 60 where a dielectric layer 62 is constructed on a substrate 64. The dielectric layer 62 contains high density plasma (HDP) oxide or low-k dielectric materials, which are defined by their lower-than-3.9 dielectric constants, using processing methods such as chemical vapor deposition (CVD) or plasma enhanced chemical vapor deposition (PECVD).

Conductive layers 66 are subsequently formed in the dielectric layer 62. During the formation of the conductive layer 66, a photoresistor layer (not shown in the figure) is coated on the surface of the dielectric layer 62. A photolithography process is performed to transfer a pattern from a mask to the photoresistor layer to define openings exposing the dielectric layer 62. An etching process using the photoresistor layer is performed to remove the dielectric layer 62 exposed by the openings, and therefore create a number of trenches in the dielectric layer 62. The photoresistor layer is stripped, and a deposition process is performed to deposit conductive materials into the trenches. A planarization process, such as etching back or chemical mechanical polishing (CMP), is performed to render a profile as shown in FIG. 6.

Figure 7:
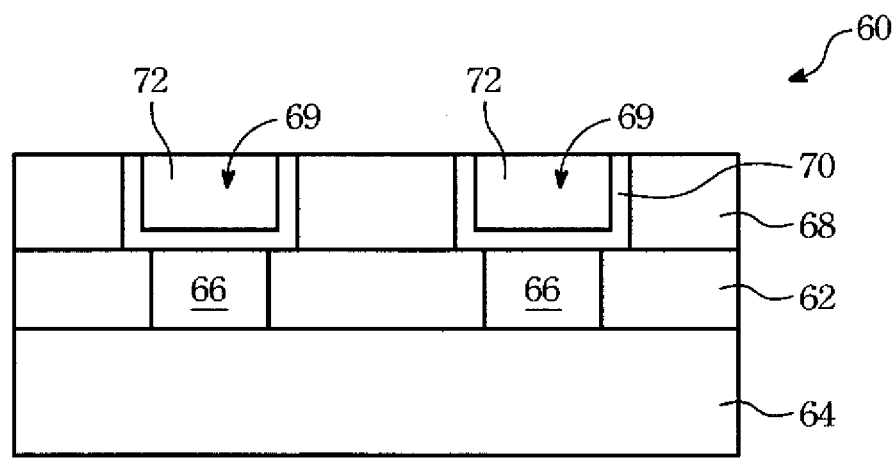

Referring to FIG. 7, a dielectric layer 68 containing HPD oxide or low-k materials is deposited over the dielectric layer 62 and the conductive layers 66 by methods such as CVD or PECVD. A number of trenches 69 are formed in the dielectric layer 68 by processes such as photolithography and etching. A conductive layer 70 is deposited over the trenches 69 in the dielectric layer 68 to form a number of crowns. A dielectric layer 72 is deposited over the conductive layer 70 (crowns). Sequentially, a planarization process is performed to produce a profile as shown in FIG. 7. The conductive layer 70 may contain materials such as TiN, TaN, TiW, or a combination thereof, with a thickness approximately ranging between 5 and 15 nm.

Figure 8:
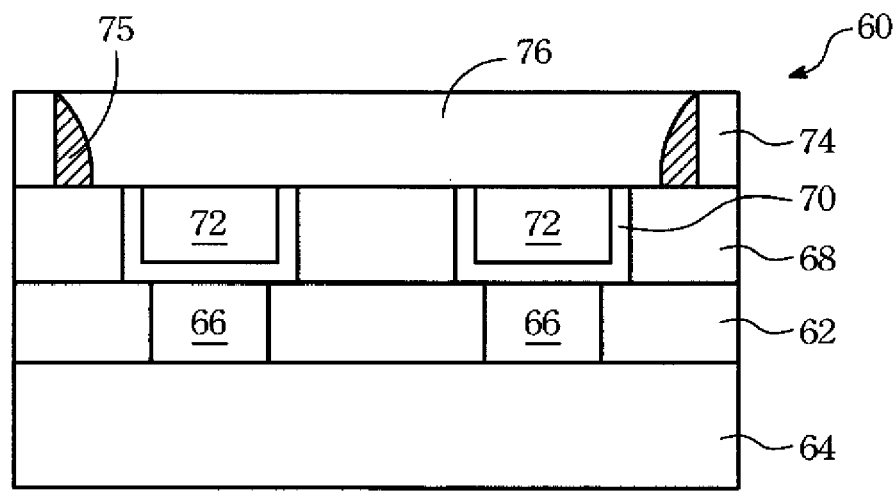

Referring to FIG. 8, a dielectric layer 74 is deposited over the dielectric layer 68, the crowns 70, and the dielectric layers 72. Subsequently, a trench 76 is formed in the dielectric layer 74 in contact with the crowns 70 and the dielectric layers 72 by methods of photolithography, etching, deposition and planarization. Trench spacers 75 can be optionally formed on the sidewalls of the trench 76. The trench 76 contains chalcogenic materials such as germanium (Ge), antimony (Sb), tellurium (Te), or an alloy thereof, and has a thickness ranging approximately from 5 to 50 nm. In one of the embodiments of the invention, the trench 76 also has a ratio of its length to its width greater than 50.

The crown 70 functions as a heater which generates heat to control the crystallization phases of the trench 76. For example, an amorphous phase can be obtained by conducting an electric current through the conductive crowns 70 to raise the temperature of the trench 76 over its melting point, and then rapidly cooling it down. A crystalline phase can be obtained by conducting an electric current through the conductive crowns 70 to raise the temperature of the trench 76 to a certain degree below the melting point, and holding it for a period of time.

Figure 9:
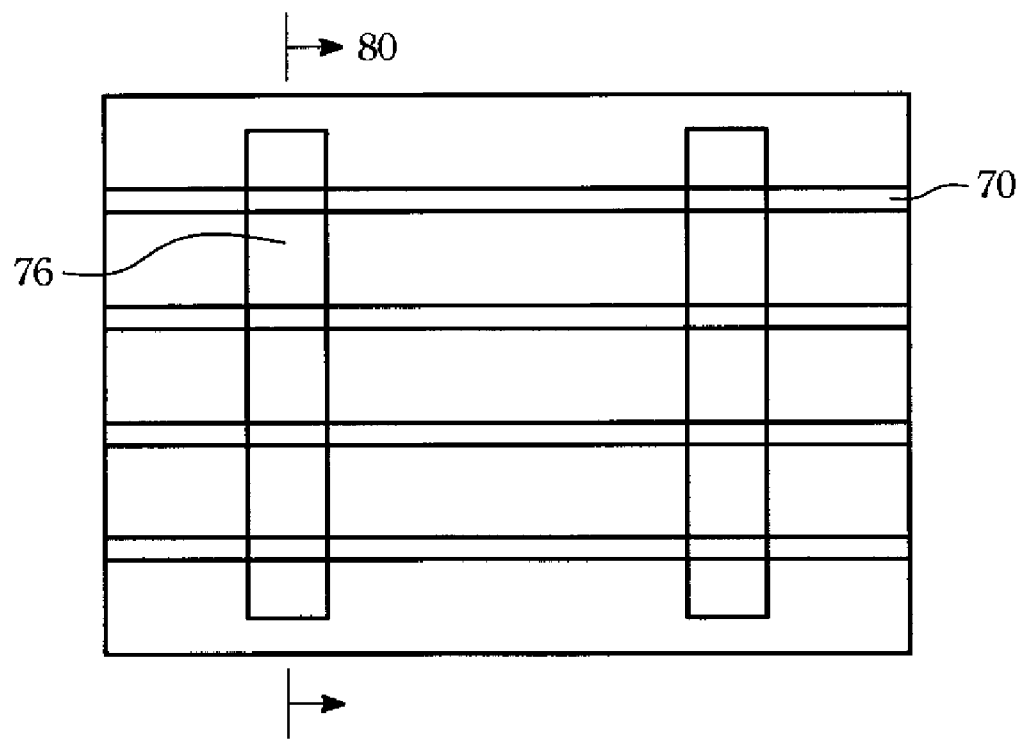

FIG. 9 illustrates a layout view of the phase change memory device 60 shown in FIG. 8 taken alone the line 80. The trench 76 extends fully across the heaters defined by the crowns 70, as opposed to the conventional phase change memory in FIG. 2 where the trench 16 are broken into a number of segments or "islands" with their ends placed at the boundaries of the resistive layers 20. As discussed above, these conventional trench "islands" are susceptible to rounding effect caused by process variations, thereby inducing reliability issues. In the embodiment of the present invention, since the trench 76 extends across the entire heater defined by the crowns 70, the rounding effect can be eliminated and the reliability of the phase change memory device can be improved.

Figure 10:
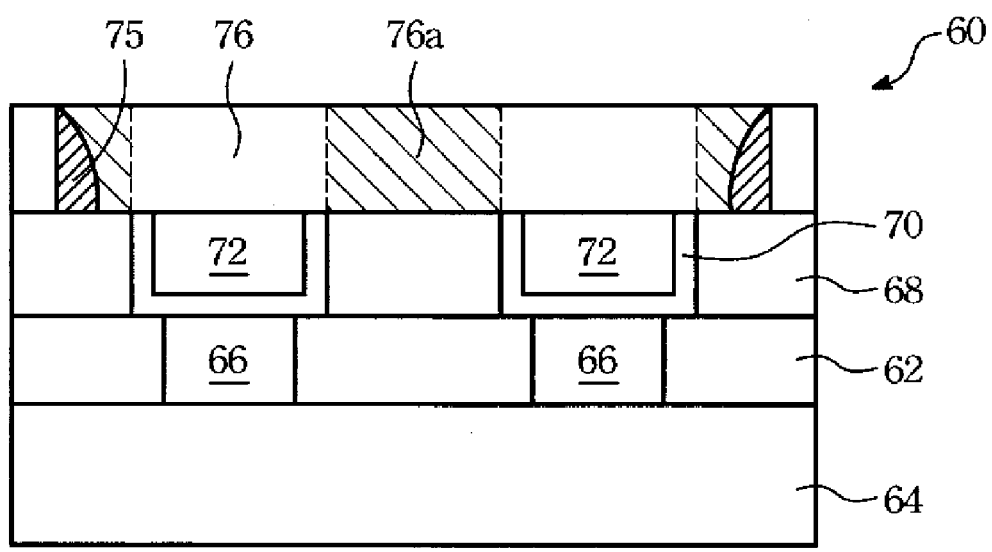

Referring to FIG. 10, the portions of the trench 76a outside the resistive crown 70 are inactivated, such that the temperature of the active trench 76 can be independently controlled for each memory cell. The inactivation process can be performed by selectively oxidizing or ion-implanting the portions 76a. Alternatively, the portions 76a outside the crown 70 can be constructed by removing that part of the trench 76 and refilled it with dielectric materials, such that the temperature of the active trench 76 can also be independently controlled for each memory cell.

Figure 11:
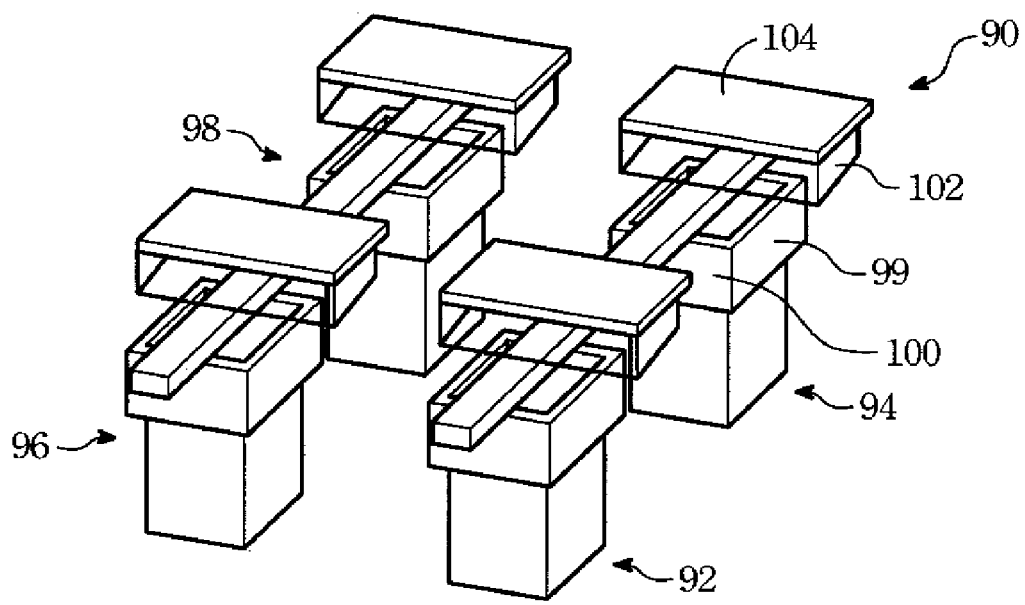
FIG. 11 illustrates a three-dimensional diagram showing a phase change memory device in accordance with one embodiment of the present invention.

FIG. 11 illustrates a three-dimensional diagram showing a phase change memory 90 including four memory cells 92, 94, 96 and 98 in accordance with one embodiment of the present invention. Each memory cell, for example cell 94, is comprised of a heater 99, a chalcogenic layer 102 and an electrode 104. A trench 100 is disposed across the entire heater 99 of the cell 94, and further extending across the cell 92. The portions of the trench 100 outside the cells 92 and 94 are inactivated, such that the programming operation of each cell can be controlled independently. In one embodiment of the present invention, the trench 100 extends across at least three heaters 99 in a row.

Figure 12:
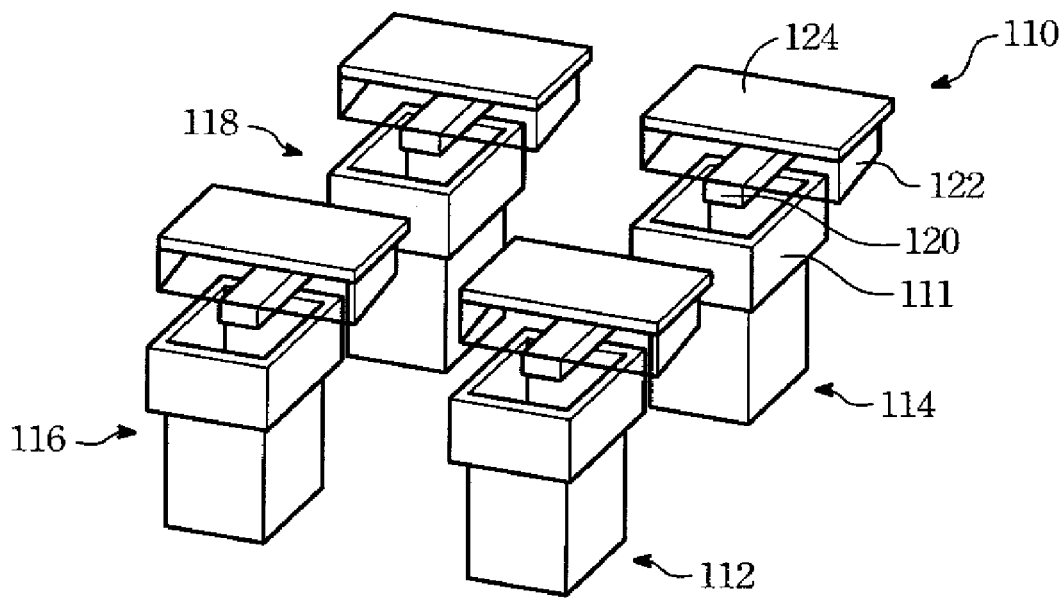
FIG. 12 illustrates a three-dimensional diagram showing a phase change memory device in accordance with another embodiment of the present invention.

FIG. 12 illustrates a three-dimensional diagram showing a phase change memory 110 including four memory cells 112, 114, 116 and 118 in accordance with another embodiment of the present invention. Each memory cell, for example cell 114, is comprised of a heater 111, a chalcogenic layer 122 and an electrode 124. A trench 120 is initially disposed across the entire heater 99 of the cell 94. Then, the portions of the trench 120 outside the cells 94 are removed, such that the programming operation of each cell can be controlled independently.

It is noted that the removed portions of the trench 120 can be refilled with dielectric materials.

The embodiments of the present invention propose methods for fabricating a phase change memory device with roundless trench conductors, thereby eliminating the rounding effects, which are often observed in the phase change memory devices manufactured by the conventional method. The rounding effect reduces the overlapping area between the trench and the heater, and therefore the device performance and reliability. The proposed embodiments of the invention eliminate the rounding effect, thereby improving the device performance and reliability.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for constructing a phase change memory device, comprising:
    forming a first dielectric layer on a substrate;
    forming a set of conductive components in the first dielectric layer;
    forming a second dielectric layer over the set of conductive components;
    forming a set of conductive crowns in the second dielectric layer, the set of conductive crowns being in contact and alignment with the set of conductive components, wherein each memory cell has one of the set of conductive crowns that functions as a heater for independent programming operation of each memory cell;
    depositing a third dielectric layer in the set of conductive crowns;
    forming a trench filled with chalcogenic layer programmable by controlling a temperature thereof to represent logic states, wherein the trench extends across a predetermined number of the conductive crowns;
    selectively removing portions of the trench disposed outside each conductive crown; and
    depositing dielectric material into the removed portions of the trench for selectively inactivating portions of the trench outside each conductive crown, such that each memory cell can be programmable without affecting neighboring cells.

2. The method of claim 1 wherein the chalcogenic layer contains germanium (Ge), antimony (Sb), tellurium (Te), or an alloy thereof.

3. The method of claim 1 wherein the set of conductive crowns contain TiN, TaN, TiW, or a combination thereof.

4. The method of claim 1 wherein the set of conductive crowns have a thickness approximately between 5 and 15 nm.

5. The method of claim 1 further comprising forming trench spacers on sidewalls of the trench.

6. The method of claim 1 wherein the trench has a width approximately ranging from 5 to 50 nm.

7. The method of claim 1 wherein the trench contains germanium (Ge), antimony (Sb), tellurium (Te), or an alloy thereof.

8. The method of claim 1 wherein the inactivating comprises oxidizing the portions of the trench outside each conductive crown.

9. The method of claim 1 wherein the inactivating comprises implanting ions into the portions of the trench outside each conductive crown.

10. A method for constructing a phase change memory device, comprising:
    forming a first dielectric layer on a substrate;
    forming a set of conductive components in the first dielectric layer;
    forming a second dielectric layer over the set of conductive components;
    forming a set of conductive crowns in the second dielectric layer, the set of conductive crowns being in contact and alignment with the set of conductive components, wherein each memory cell has one of the set of conductive crowns that functions as a heater for independent programming operation of each memory cell;
    depositing a third dielectric layer in the set of conductive crowns;
    forming a trench filled with chalcogenic layer programmable by controlling a temperature thereof to represent logic states, wherein the trench extends across a predetermined number of the conductive crowns, such that the trench is free from rounded end portions caused by lithography during fabrication of the phase change memory device, wherein the trench has a ratio of its length to its width greater than 50; and
    selectively inactivating portions of the trench outside each conductive crown, such that each memory cell can be programmable without affecting neighboring cells.

11. The method of claim 10 wherein the chalcogenic layer contains germanium (Ge), antimony (Sb), tellurium (Te), or an alloy thereof.

12. The method of claim 10 wherein the set of conductive crowns contain TiN, TaN, TiW, or a combination thereof.

13. The method of claim 10 further comprising forming trench spacers on sidewalls of the trench.

14. The method of claim 10 wherein the trench contains germanium (Ge), antimony (Sb), tellurium (Te), or an alloy thereof.

15. A method for constructing a phase change memory device, comprising:
    forming a first dielectric layer on a substrate;
    forming a set of conductive components in the first dielectric layer;
    forming a second dielectric layer over the set of conductive components;
    forming a set of heaters in the second dielectric layer, the set of heaters being in contact and alignment with the set of conductive components, wherein each memory cell has one of the set of heaters for independent programming operation of each memory cell;
    depositing a third dielectric layer in the set of heaters;
    forming a trench filled with chalcogenic layer programmable by controlling a temperature thereof to represent logic states, wherein the trench extends across at least two heaters, such that the trench is free from rounded end portions caused by lithography during fabrication of the phase change memory device; and
    selectively inactivating portions of the trench outside each heater, such that each memory cell can be programmable without affecting neighboring cells.

16. The method of claim 15 further comprising forming trench spacers on sidewalls of the trench.

17. The method of claim 15, wherein the selectively inactivating comprising:
- selectively removing portions of the trench disposed outside each heater; and
- depositing dielectric material into the removed portions of the trench.

18. The method of claim 15 wherein the chalcogenic layer contains germanium (Ge), antimony (Sb), tellurium (Te), or an alloy thereof.

19. The method of claim 15 wherein the set of heaters contain TiN, TaN, TiW, or a combination thereof.

20. The method of claim 15 wherein the inactivating comprises implanting ions into the portions of the trench outside each of the set of heaters.

* * * * *